(12) United States Patent
Mizukami

(10) Patent No.: US 11,217,580 B2
(45) Date of Patent: Jan. 4, 2022

(54) SEMICONDUCTOR DEVICE INCLUDING INSULATED GATE BIPOLAR TRANSISTOR ELEMENT AND FREEWHEELING DIODE ELEMENT

(71) Applicant: DENSO CORPORATION, Kariya (JP)

(72) Inventor: Taku Mizukami, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/188,533

(22) Filed: Nov. 13, 2018

(65) Prior Publication Data

US 2019/0081163 A1 Mar. 14, 2019

Related U.S. Application Data

(63) Continuation of application No. PCT/JP2017/015874, filed on Apr. 20, 2017.

(30) Foreign Application Priority Data

May 17, 2016 (JP) .............................. JP2016-098875

(51) Int. Cl.
*H01L 29/06* (2006.01)
*H01L 27/07* (2006.01)
(Continued)

(52) U.S. Cl.
CPC ...... *H01L 27/0727* (2013.01); *H01L 29/0607* (2013.01); *H01L 29/0676* (2013.01);
(Continued)

(58) Field of Classification Search
CPC ............ H01L 29/7395; H01L 29/7412; H01L 27/0647–0664; H01L 29/73–7416;
(Continued)

(56) References Cited

U.S. PATENT DOCUMENTS

2008/0315248 A1 12/2008 Tokura et al.
2012/0132954 A1 5/2012 Kouno et al.
(Continued)

FOREIGN PATENT DOCUMENTS

| JP | 2011-238681 A | 11/2011 |
| JP | 2013-021142 A | 1/2013 |
| JP | 2013-080796 A | 5/2013 |

OTHER PUBLICATIONS

Human translation of IDS reference, JP 2013-080796.*

*Primary Examiner* — Suberr L Chi
(74) *Attorney, Agent, or Firm* — Posz Law Group, PLC

(57) ABSTRACT

A semiconductor device includes a single semiconductor substrate on which an IGBT region including an IGBT element and an FWD region including a FWD element are formed. In the semiconductor device, a cathode layer is formed with a carrier injection layer, which is electrically connected to a second electrode and has a PN junction with a field stop layer. When a first carrier in the FWD element passes through the field stop layer on the carrier injection layer and flows into the cathode layer in a situation where a forward-biased current is cut off from a state in which the forward-biased current is flowing through the FWD element, a second carrier is injected from the second electrode into a drift layer through the carrier injection layer.

4 Claims, 5 Drawing Sheets

(51) Int. Cl.
    *H01L 29/861*     (2006.01)
    *H01L 29/08*     (2006.01)
    *H01L 29/10*     (2006.01)
    *H01L 29/423*     (2006.01)
    *H01L 29/739*     (2006.01)
    *H01L 29/40*     (2006.01)

(52) U.S. Cl.
    CPC ...... *H01L 29/0813* (2013.01); *H01L 29/0826* (2013.01); *H01L 29/1095* (2013.01); *H01L 29/42304* (2013.01); *H01L 29/7397* (2013.01); *H01L 29/861* (2013.01); *H01L 29/8611* (2013.01); *H01L 29/407* (2013.01)

(58) Field of Classification Search
    CPC ..... H01L 27/0652–0664; H01L 27/075–0788; H01L 27/1021; H01L 29/7416; H01L 29/7805; H01L 29/7819
    See application file for complete search history.

(56) References Cited

U.S. PATENT DOCUMENTS

| | | | |
|---|---|---|---|
| 2013/0087829 A1* | 4/2013 | Tanabe | H01L 29/66348 |
| | | | 257/140 |
| 2014/0084337 A1 | 3/2014 | Matsudai et al. | |
| 2014/0231867 A1 | 8/2014 | Yamashita et al. | |
| 2015/0115316 A1 | 4/2015 | Oyama et al. | |
| 2017/0162562 A1* | 6/2017 | Haruguchi | H01L 29/4238 |

* cited by examiner

SEMICONDUCTOR DEVICE INCLUDING INSULATED GATE BIPOLAR TRANSISTOR ELEMENT AND FREEWHEELING DIODE ELEMENT

CROSS REFERENCE TO RELATED APPLICATIONS

The present application is a continuation application of International Patent Application No. PCT/JP2017/015874 filed on Apr. 20, 2017, which designated the U.S. and claims the benefit of priority from Japanese Patent Application No. 2016-98875 filed on May 17, 2016. The entire disclosures of all of the above applications are incorporated herein by reference.

TECHNICAL FIELD

The present disclosure relates to a semiconductor device in which an insulated gate bipolar transistor element (hereinafter referred to as IGBT element) with an insulated gate structure and a freewheeling diode element (hereinafter referred to as FWD element) are on a semiconductor substrate.

BACKGROUND

A semiconductor device is provided with an IGBT region having an IGBT element and an FWD region having an FWD element on a semiconductor substrate.

SUMMARY

The present disclosure provides a semiconductor device with an IGBT element and an FWD element on a semiconductor substrate. The semiconductor substrate having the IGBT and FWD regions includes: a drift layer having a first-type conductivity; a base layer having a second-type conductivity; an emitter region having the first-type conductivity and having a higher impurity concentration as compared with the drift layer; a gate insulation film; a gate electrode; a field stop layer having the first-type conductivity and having a higher impurity concentration as compared with the drift layer; a collector layer having the second-type conductivity; a cathode layer having the first-type conductivity and being adjacent to the collector layer; a first electrode electrically connected to the base layer and the emitter region; and a second electrode electrically connected to the collector layer and the cathode layer.

The cathode layer is formed with a carrier injection layer having the second-type conductivity at a position isolated from the collector layer, and the carrier injection layer has a PN junction with the field stop layer and is electrically connected to the second electrode.

BRIEF DESCRIPTION OF DRAWINGS

The above and other objects, features and advantages of the present disclosure will become more apparent from the following detailed description made with reference to the accompanying drawings. In the drawings.

DETAILED DESCRIPTION

Figure 1:
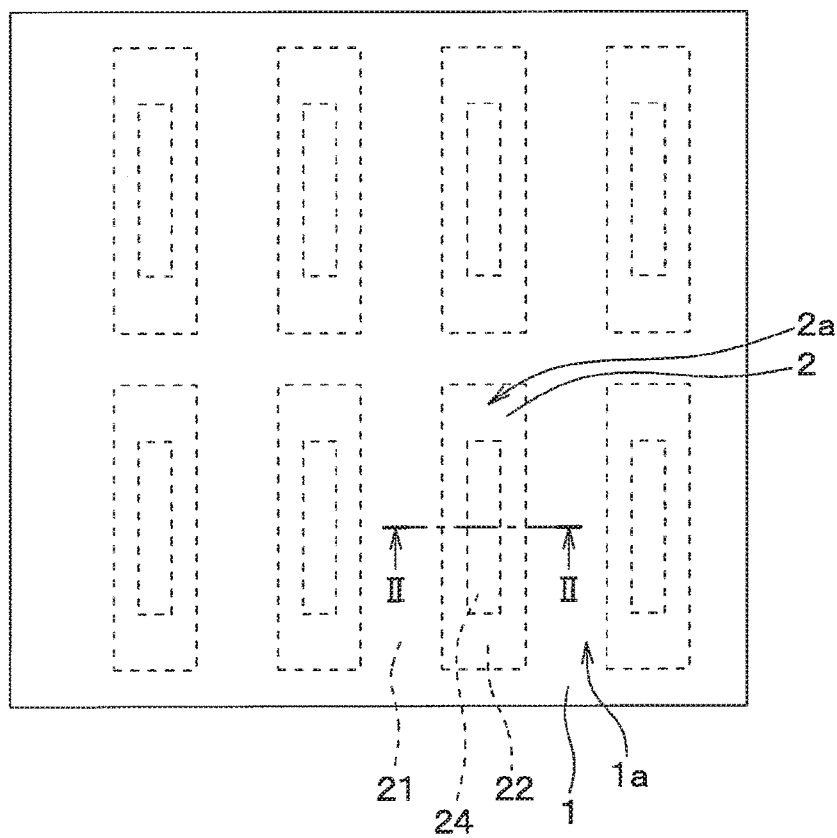
FIG. 1 is a schematic plan view of a semiconductor device.

A semiconductor device as a switching element is used for an inverter or the like. With regard to this type of semiconductor device, an IGBT region having an IGBT element and an FWD region having an FWD element are on a single semiconductor substrate.

In particular, with regard to this type of semiconductor device, a base layer is formed on a surface layer of the semiconductor substrate provided with N− type drift layer, and a plurality of trenches are formed to penetrate the base layer. Further, a gate insulation film and a gate electrode are formed at each trench in order. An N+ type emitter region is formed at the surface layer portion of the base layer. The N+ type emitter region is formed to be in contact with the trench. A P+ type collector layer and an N+ type cathode layer are formed at the rear surface of the semiconductor substrate.

Further, an upper electrode is formed at the surface of the semiconductor substrate. The upper electrode is electrically connected to the base layer and the emitter layer. A lower electrode is formed at the rear surface of the semiconductor substrate. The lower electrode is electrically connected to the collector layer and the cathode layer.

With regard to this type of semiconductor device, a region where the collector layer is formed at the rear surface of the semiconductor substrate is regarded as the IGBT region; and a region where the cathode region is formed at the rear surface of the semiconductor substrate is regarded as a FWD region. The IGBT region has an IGBT element, and the FWD region has an FWD element. With regard to the FWD region, the FWD element has a PN junction having the N type cathode layer and N type drift layer as well as P type base layer.

With regard to the IGBT element in the semiconductor device, an N type inversion layer (that is, channel) is formed at a portion of the base layer, which is in contact with the channel in response to a voltage applied to the upper electrode and a predetermined voltage applied to the gate electrode. The voltage applied to the upper electrode is lower than the voltage of the lower electrode. With regard to the IGBT element, electrons are supplied to the drift layer through the inversion layer from the emitter region, and holes are supplied to the drift layer from the collector layer. Thus, the resistance value of the drift layer is lowered and the IGBT element is turned on through conductivity modulation.

With regard to the FWD element, holes are supplied to the drift layer from the base layer and electrons are supplied to the drift layer from the cathode layer in response to a voltage applied to the upper electrode. The voltage applied to the upper electrode is higher than a voltage of the lower electrode. Thus, the FWD element is turned on. Subsequently, when a voltage higher than a voltage of the upper electrode is applied to the lower electrode of the FWD element, holes accumulated inside the FWD element are attracted to the upper electrode. Thus, the FWD element generates a recovery current and then is in a recovery state. The FWD element is turned off after the recovery state has passed.

However, the present inventors found out the following matters when the FWD element is switched from an on-state to an off-state during the recovery state. In the recovery state, the depletion layer between the drift layer and base layer extends to the lower electrode of the semiconductor device (in other words, the rear surface of the semiconductor substrate. Thus, a peak surge voltage during the recovery state gets larger. The semiconductor device may be damaged by an enlarging peak surge voltage during the recovery state.

In this disclosure, a semiconductor device is provided with an IGBT region having an IGBT element and an FWD region having an FWD element. The semiconductor device includes a semiconductor substrate having the IGBT and FWD regions. The semiconductor substrate includes a drift layer, a base layer, an emitter region, a gate insulation film, a gate electrode, a field stop layer, a collector layer, a cathode layer, a first electrode and a second electrode.

The drift layer has a first-type conductivity. The base layer has a second-type conductivity and formed on the drift layer. The emitter region has the first-type conductivity configured to be a surface layer portion of the base layer, and is configured to be isolated from the drift layer to interpose the base layer between the drift layer and the emitter region. The emitter region has a higher impurity concentration as compared with the drift layer. The gate insulation film is arranged on a surface of the base layer, which is between the emitter region and the drift layer. The gate electrode is arranged on the gate insulation film. The field stop layer has the first-type conductivity facing the base layer to interpose the drift layer between the field stop layer and the base layer, and it has a higher impurity concentration as compared with the drift layer. The collector layer has the second-type conductivity facing the drift layer to interpose the field stop layer between the collector layer and the drift layer. The cathode layer has the first-type conductivity facing the drift layer to interpose the field stop layer between the cathode layer and the drift layer, and it is adjacent to the collector layer. The first electrode electrically connected to the base layer and the emitter region, and the second electrode electrically connected to the collector layer and the cathode layer.

The cathode layer is formed with a single carrier injection layer having the second-type conductivity at a position isolated from the collector layer. The single carrier injection layer has a PN junction with the field stop layer and is electrically connected to the second electrode. When a first carrier in the FWD element passes through the field stop layer on the carrier injection layer and flows into the cathode layer in a situation where a forward-biased current is cut off from a state in which the forward-biased current flows through the FWD element, a second carrier is injected from the second electrode into the drift layer through the carrier injection layer.

Accordingly, when the semiconductor device is at the recovery state, it inhibits the depletion layer, which is formed between the base layer and the drift layer, to extend to the second electrode while reducing the peak surge voltage at the recovery state.

The following describes several embodiments of the present disclosure with reference to the drawings in detail. In the following embodiments, the same or equivalent parts are denoted by the same reference numerals.

First Embodiment

The following describes a first embodiment with reference to the drawings. A semiconductor device according to the present embodiment may be used as a power switching device. The power switching device may be used for a power supply circuit such as an inverter or DC/DC converter.

As illustrated in FIG. 1, the semiconductor device includes: an IGBT region 1 having an IGBT element 1a; and a FWD region 2 having an FWD element 2a. The IGBT region 1 and the FWD region 2 are formed in the same chip. The semiconductor device is an RC (Reverse Conducting)-IGBT.

Figure 2:
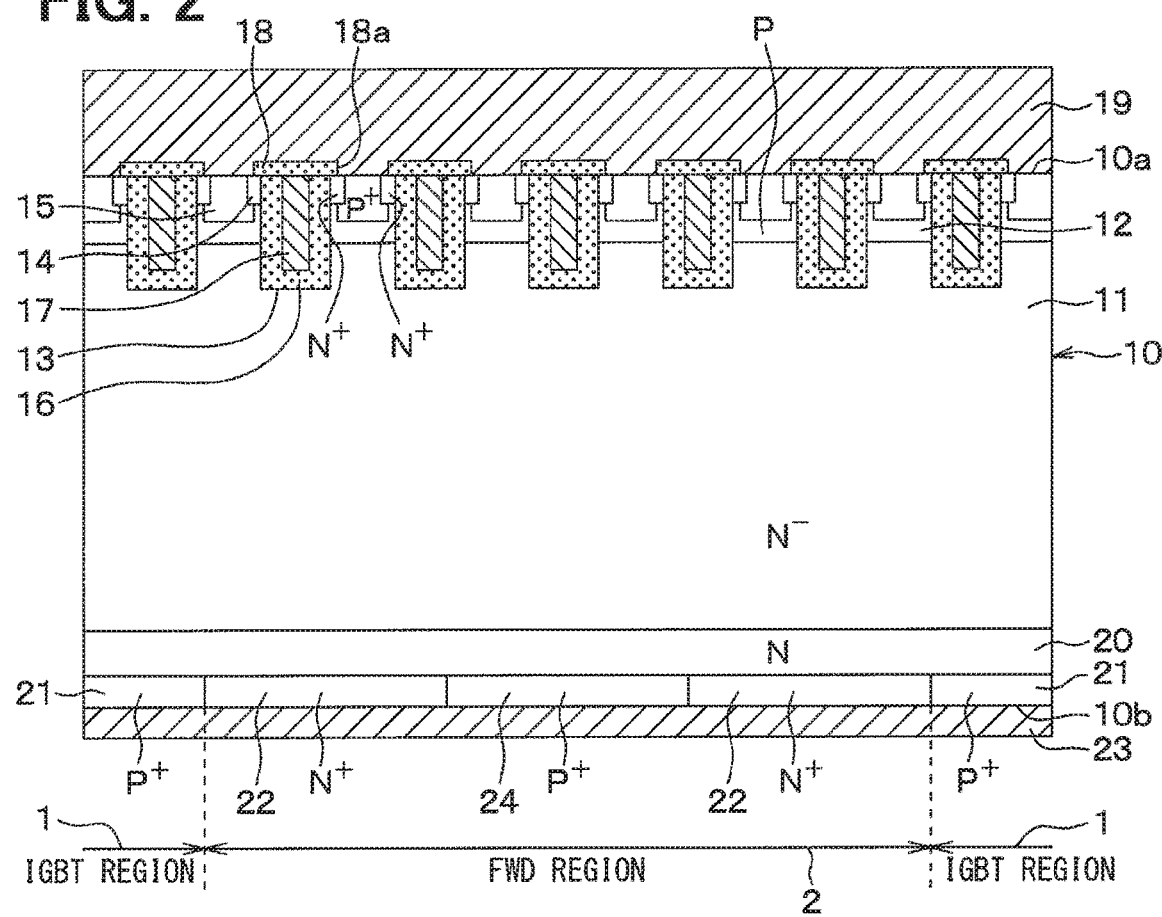
FIG. 2 is a cross-sectional view taken along a line II-II shown in FIG. 1.

In particular, the semiconductor device includes a semiconductor substrate 10 having an N− type drift layer 11 as illustrated in FIG. 2. According to the present embodiment, the semiconductor substrate 10 is configured by a silicon substrate. A P type base layer 12 is formed on the drift layer 11. The base layer 12 is formed by heat processing after ion-injection of P type impurities from a first surface 10a of the semiconductor substrate 10.

A plurality of trenches 13 is formed at the semiconductor substrate 10. The plurality of trenches 13 penetrate the base layer 12 and reach the drift layer 11. The base layer 12 is separated into several parts by the trenches 13. The plurality of trenches 13 is formed in each of the IGBT region 1 and the FWD region 2. The plurality of trenches 13 are formed along one of the planar direction with respect to the first surface 10a of the semiconductor substrate 10 (that is, a direction perpendicular to the sheet of FIG. 2). The plurality of trenches 13 is equally spaced.

An N+ type emitter region 14 and a P+ type collector region 15 are formed at the surface layer portion of the base layer 12, that is, the first surface 10a of the semiconductor substrate 10. The N+ type emitter region 14 has a higher impurity concentration as compared with the drift layer 11. The P+ type collector region 15 has a higher impurity concentration as compared with the base layer 12. In particular, the emitter region 14 has an end portion inside the base layer 12, and is connected to the side surface of the trench 13. Similar to the emitter region 14, the collector region 15 also terminates inside the base layer 12.

More specifically, the emitter region 14 is extended in the form of a bar in contact with the side surface of the trench 13 along the longitudinal direction of the trench 13 in a region between the adjacent trenches 13. The emitter region 14 terminates inside the tip of the trench 13. The collector region 15 is sandwiched between two emitter regions 14 and is extended in the form of a bar along the longitudinal direction of the trench 13 (that is, the emitter region 14). The collector region 15 is formed to be at a deeper level as compared with the emitter region 14 with reference to the first surface 10a of the semiconductor substrate 10.

Each trench 13 is filled with a gate insulation film 16 and a gate electrode 17. The gate insulation film 16 is formed to cover the wall surface of each trench 13. The gate electrode 17 is formed by polysilicon formed on the gate insulation film 16. Accordingly, the trench gate structure is configured as mentioned above. A portion of the wall surface of the trench 13 situated between the emitter region 14 and the drift layer 11 corresponds to the front surface of the base layer situated between the emitter region and the drift region.

An interlayer insulation film 18 is formed on the first surface 10a of the semiconductor substrate 10. The interlayer insulation film 18 is configured by, for example, BPSG. An upper electrode 19 is formed on the interlayer insulation film 18. The upper electrode 19 is electrically connected to the emitter region 14 and the collector region 15 (that is, the base layer 12) through a contact hole 18a formed at the interlayer insulation film 18. In other words, the upper electrode 19 is formed on the interlayer insulation film 18 that functions as an emitter electrode at the IGBT region 1 and functions as an anode electrode at the FWD region 2. According to the present embodiment, the upper electrode 19 corresponds to a first electrode.

An N type field stop layer (hereinafter referred to as "FS layer") 20 is formed at one side of the drift layer 11, which is opposite to the base layer 12 (that is, a second surface 10b side of the semiconductor substrate 10). The FS layer 20 has a higher impurity concentration as compared with the drift layer 11.

In the IGBT region 1, the P+ type collector layer 21 is formed to be opposite to the drift layer 11 such that the FS layer 20 is interposed between the collector layer 21 and the drift layer 11. In the FWD region 2, the N+ type cathode layer 22 is formed to be opposite to the drift layer 11 such that the FS layer 20 is interposed between the drift layer 11 and the cathode layer 22. The collector layer 21 and the cathode layer 22 are adjacent to each other. The collector layer 21 and the cathode layer 22 are opposite to the drift layer 11 such that the FS layer is interposed between the drift layer 11 and the both of the collector layer 21 and the cathode layer 22. The IGBT region 1 and the FWD region 2 are partitioned by whether a layer formed at the second surface 10b of the semiconductor substrate 10 is the collector layer 21 or the cathode layer 22. On other hands, the portion on the collector layer 21 is the IGBT region 1, and the portion on the cathode layer 22 is the FWD region 2. The cathode layer 22 is extended along one of the planar direction (that is, in the vertical direction of the sheet of FIG. 1) of the semiconductor substrate 10 as illustrated in FIG. 1.

As illustrated in FIG. 2, a lower electrode 23 is formed to be opposite to the drift layer 11 such that the collector layer 21 and the cathode layer 22 are interposed between the lower electrode 23 and the drift layer 11. In other words, the lower electrode 23 is at the second surface 10b of the semiconductor substrate 10. The lower electrode 23 is electrically connected to the collector layer 21 and the cathode layer 22. In other words, the lower electrode 21 functions as a collector electrode in the IGBT region 1, and functions as a cathode electrode in the FWD region 2. According to the present embodiment, the lower electrode 23 corresponds to the second electrode.

According to the above-mentioned configuration, the base layer 12 and the contact region 15 are configured as an anode in the FWD region 2; and the drift layer 21, the FS layer 20 and the cathode layer 22 are configured as a cathode. Accordingly, the FWD element 2a with a PN junction is configured as described above.

The cathode layer 22 is electrically connected to the lower electrode 23 and has a PN-junction with the FS layer 20. A P+ type carrier injection layer 24 is formed at the cathode layer 22. The carrier injection layer 24 is at a position distant from the collector layer 21. In particular, as illustrated in FIGS. 1 and 2, the carrier injection layer 24 is extended in an extension direction of the cathode layer 22. The carrier injection layer 24 includes the center of the cathode layer 22 in a width direction so as to form symmetrically with respect to the center. More specifically, the center of the carrier injection layer 24 in the width direction coincides with the center of the cathode layer 22 in the width direction.

The width direction (in other words, the horizontal direction of the sheet of FIG. 2) of the cathode layer 22 is parallel to a planar direction of the semiconductor substrate 10, and is perpendicular to the extension direction of the cathode layer 22. The width direction (in other words, the horizontal direction of the sheet of FIG. 2) of the carrier injection layer 24 is parallel to the planner direction of the semiconductor substrate 10, and is perpendicular to the extension direction of the carrier injection layer 24.

The above description refers to the configuration of the semiconductor device in the present embodiment. According to the present embodiment, N type, N+ type and N− type correspond to a first-type conductivity; and P type and P+ type correspond to a second-type conductivity. The following describes the operation of the semiconductor device.

With regard to the semiconductor device, when a voltage higher than the voltage of the upper electrode 19 is applied to the lower electrode 23, the PN junction formed between the base layer 12 and the drift layer 11 is in a reverse-conduction state and then the depletion layer is formed. When a low-level voltage, which is less than a threshold voltage Vth of the insulated gate structure, is applied to the gate electrode 17, the current does not flow between the upper electrode 19 and the lower electrode 23. The low-level voltage may be 0 volt.

For turning on the IGBT element 1a, a high-level voltage, which is higher than or equal to the threshold voltage Vth of the insulated gate structure, is applied to the gate electrode 17 in a situation where a higher voltage, which is larger than the voltage of the upper electrode 19, is applied to the lower electrode 23. The inversion layer is formed at a portion of the base layer 12 in contact with the trench 13 where the gate electrode 17 is arranged. The IGBT element 1a is turned on when holes are supplied from the collector layer 21 to the drift layer 11 because of the supply of electrons from the emitter region 14 to the drift layer 11 through the inversion layer to lower the resistance value of the drift layer 11 through conductivity modulation.

For turning off the IGBT element 1a and turning on the FWD element 2a (in other words, causing the FWD element 2a to perform a diode operation), the voltages respectively applied to the upper electrode 19 and the lower electrode 23 so that the upper electrode 19 is applied with a voltage higher than the voltage of the lower electrode 23. A low-level voltage less than the threshold voltage Vth is applied to the gate electrode 17. For example, the low-level voltage may be 0 volt. Thus, the inversion layer is not formed at a portion of the base layer 12 in contact with the trench 13. The FWD diode 2a is in a diode operation because of the supply of holes from the base layer 12 and the supply of electrons from the cathode layer 22.

Subsequently, for switching the FWD element 2a from an on-state to an off-state, an application of reverse voltage is carried out to apply a voltage, which is higher than the voltage of the upper electrode 19, to the lower electrode 23. In other words, for cutting off a forward-biased current from a state in which the forward-biased current flows through the FWD element 2a, an application of reverse voltage is carried out to apply a voltage, which is higher than the voltage of the upper electrode 19, to the lower electrode 23. As a result, the FWD element 2a is in a recovery state. In other words, the holes in the base layer 12 are attracted to the upper electrode 19, and the electrons in the drift layer 11 are attracted to the lower electrode 23. As a result, the recovery current is generated and the depletion layer between the base layer 12 and the drift layer 11 is extended.

Figure 3:
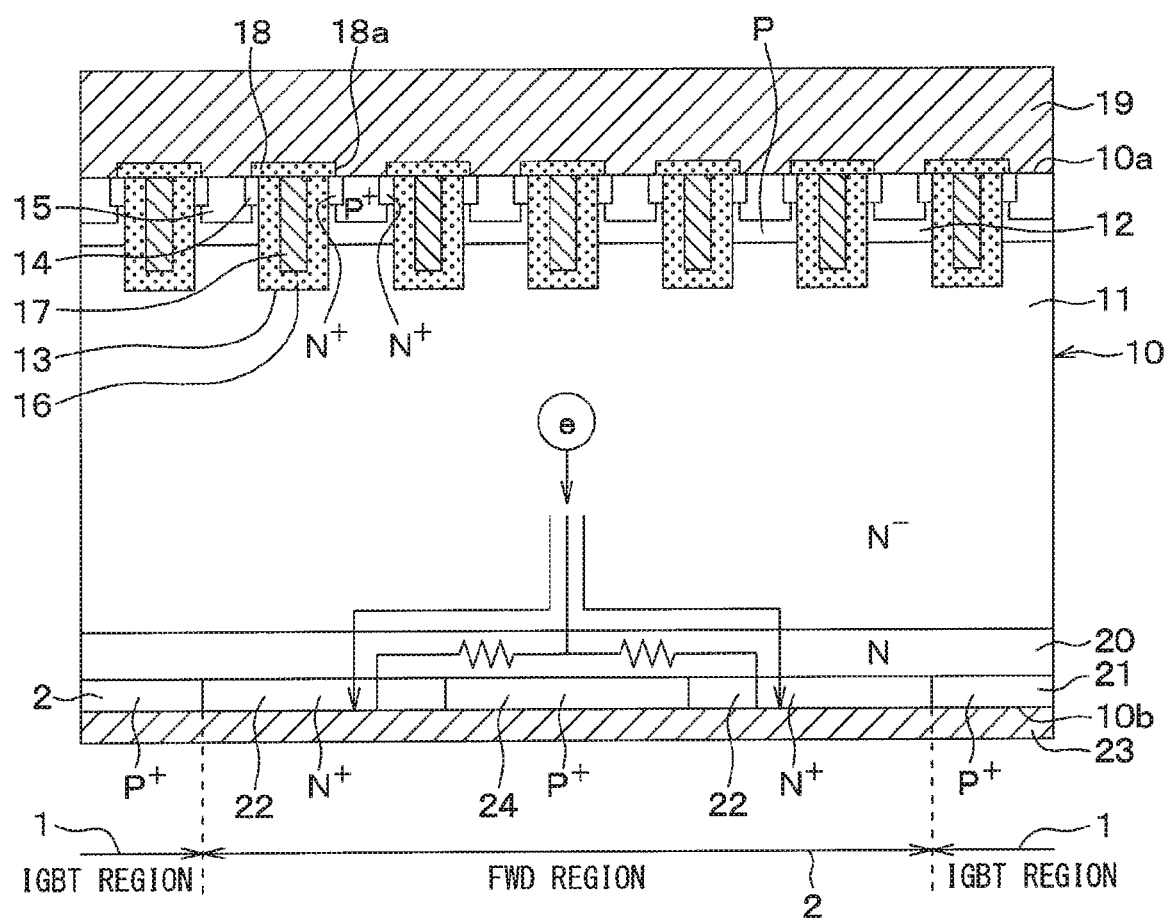
FIG. 3 is a schematic diagram showing the movement of electrons when a recovery current flows.

The electrons arrived at the FS layer 20 on the carrier injection layer 24 cannot reach the lower electrode 23 through the carrier injection layer 24 because of a potential barrier caused by the PN junction formed between the carrier injection layer 24 and the FS layer 20. As illustrated in FIG. 3, the electrons arrived at the FS layer on the carrier injection layer 24 flow from the cathode layer 22, which is adjacent to the carrier injection layer 24, to the lower electrode 23 after the electrons move from the FS layer 20 along a planar direction of the semiconductor substrate 10. The potential level of the FS layer 20 on the carrier injection layer 24 drops, and the voltage across the PN junction formed between the carrier injection layer 24 and the FS layer 20 rises.

Figure 4:
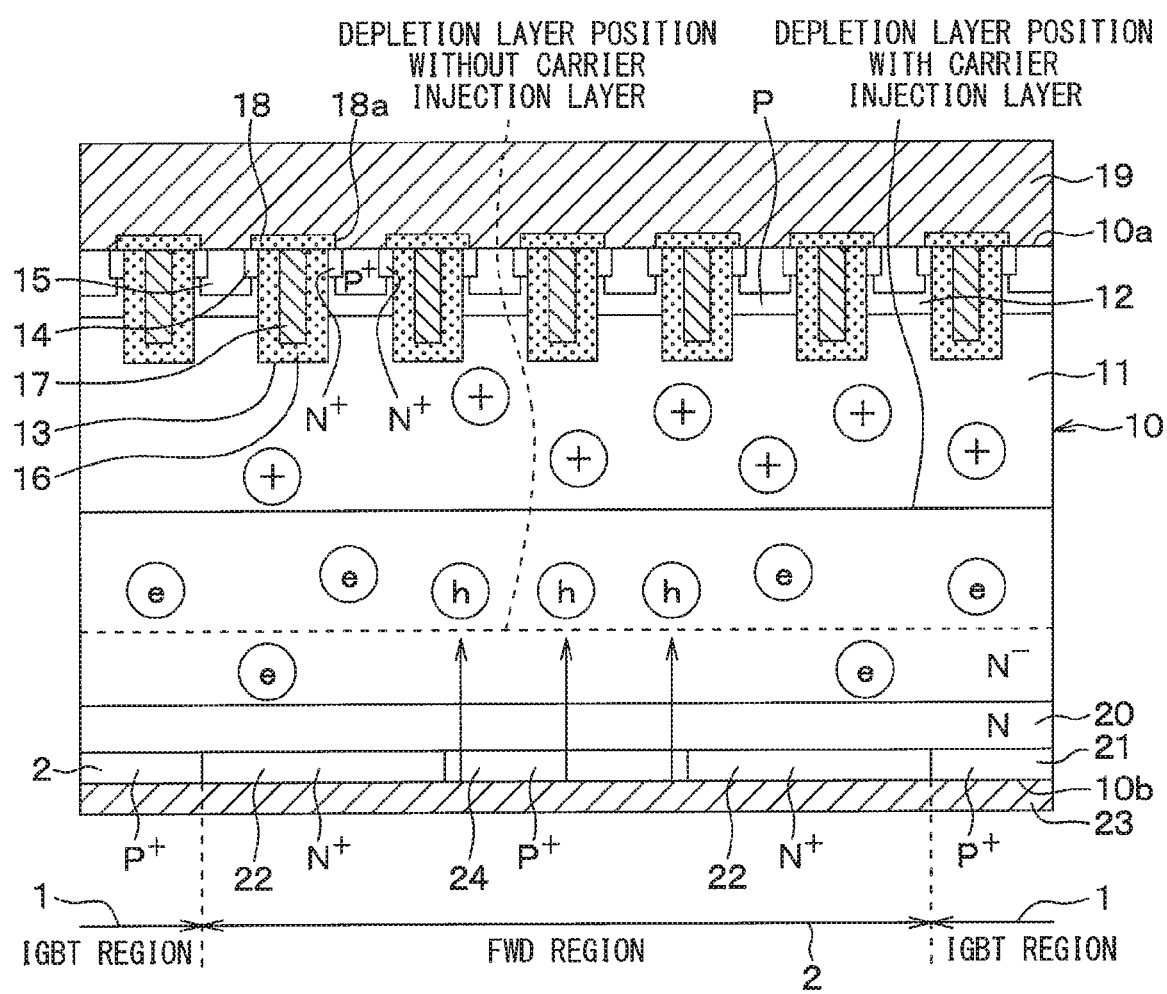
FIG. 4 is a schematic diagram showing a depletion layer at a recovery state.
Figure 5:
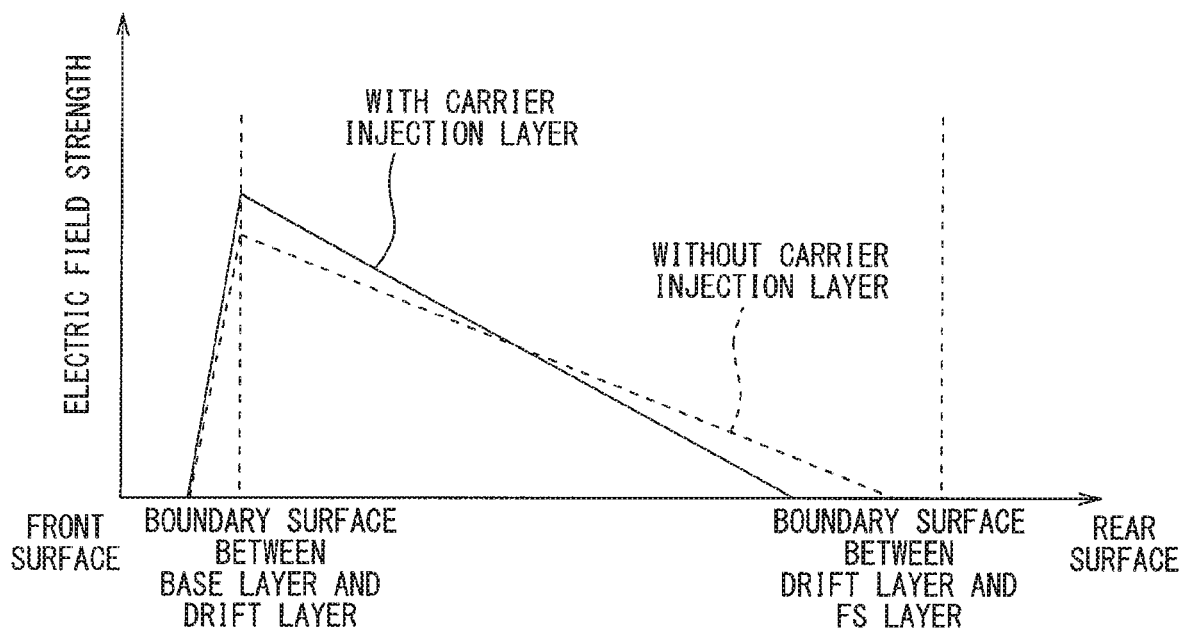
FIG. 5 is a diagram showing the electric field strength of a depletion layer.

As illustrated in FIG. 4, the voltage across the PN junction formed between the carrier injection layer 24 and the FS layer 20 exceeds the potential barrier (that is, about 0.7 volt), a forward-biased voltage is applied to the carrier injection layer 24 and the FS layer 20. The holes are injected to the drift layer 11 through the carrier injection layer 24, and the space charge density in the drift layer 11 rises. Accordingly, as compared with the situation where the carrier injection layer 24 is not provided, it is difficult for the depletion layer to extend towards the second surface 10b of the semiconductor substrate 10. In other words, as illustrated in FIG. 5, the position where the electric field strength is zero at a position distant from the FS layer 20 as compared with a situation where the carrier injection layer 24 is not provided. According to the present embodiment, the electron corresponds to a first carrier, and the hole corresponds to a second carrier.

For making the holes to be injected from the carrier injection layer 24 to the drift layer 11 during the recovery state, it is required that the voltage across the PN junction formed between the carrier injection layer 24 and the FS layer 20 exceeds the potential barrier. When the width of the carrier injection layer 24 is too short, the potential level of the FS layer 20 on the carrier injection layer 24 does not drop sufficiently, and the voltage across the PN junction formed between the carrier injection layer 24 and the FS layer 20 does not rise sufficiently. In other words, when the moving distance of the electrons in the FS layer 20 along the planar direction of the semiconductor substrate 10 is too short, the potential level of the FS layer 20 on the carrier injection layer 24 does not drop sufficiently, and the voltage across the PN junction formed between the carrier injection layer 24 and the FS layer 20 does not rise sufficiently.

Figure 6:
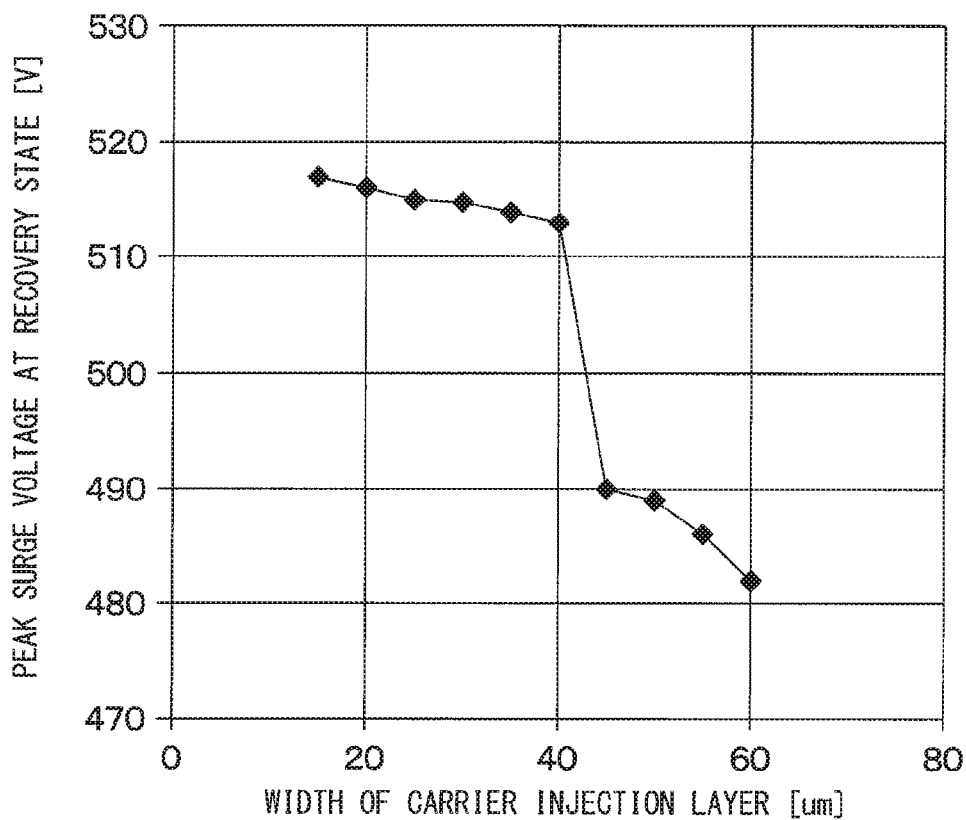
FIG. 6 is a diagram showing a relationship between a peak surge voltage during the recovery state and a width of a carrier injection layer.

For example, as illustrated in FIG. 6, the peak surge voltage during the recovery state is high when the width of the carrier injection layer 24 is configured to be less than 40 µm; however, the peak surge voltage dramatically drops when the width of the carrier injection layer 24 is configured to be larger than or equal to 40 µm. When the width of the carrier injection layer 24 is less than 40 µm, the voltage across the PN junction formed between the carrier injection layer 24 and the FS layer 20 does not rise sufficiently, and the holes from the carrier injection layer 24 are not injected during the recovery state. When the peak surge voltage during the recovery state is lower, the width of the carrier injection layer 24 is larger than or equal to 40 µm. Accordingly, the voltage across the PN junction formed between the carrier injection layer 24 and the FS layer 20 rises sufficiently and the holes from the carrier injection layer 24 is injected during the recovery state.

FIG. 6 illustrates a simulation result for showing the relationship between the peak surge voltage during the recovery state and the width of the carrier injection layer 24 in the semiconductor device as mentioned above. The impurity concentration of the FS layer 20 is $3.0 \times 10^{16}$ cm$^{-3}$, and the width of the cathode layer 22 (in other words, the width of the FWD region 2) is set to be a predetermined width. FIG. 6 illustrates that the peak surge voltage slowly drops as the width of the carrier injection layer 24 gets longer from 20 µm to 40 µm and from 45 µm to 60 µm. Accordingly, the remaining width of the cathode layer 22 is relatively changed by a change in the width of the carrier injection layer 24. In other words, the total amount of electrons supplied from the cathode layer 22 to the drift layer 11 changes when the FWD element 2a is in the on-state.

For making the holes to be injected into the drift layer 11 from the carrier injection layer 24 during the recovery state, the potential level of the FS layer 20 on the carrier injection layer 24 does not drop sufficiently even if the carrier injection layer 24 and the FS layer 20 has a very high impurity concentration. In other words, the potential level of the FS layer 20 on the carrier injection layer 24 does not drop sufficiently even when the resistance value of the FS layer 20 is very low.

Figure 7:
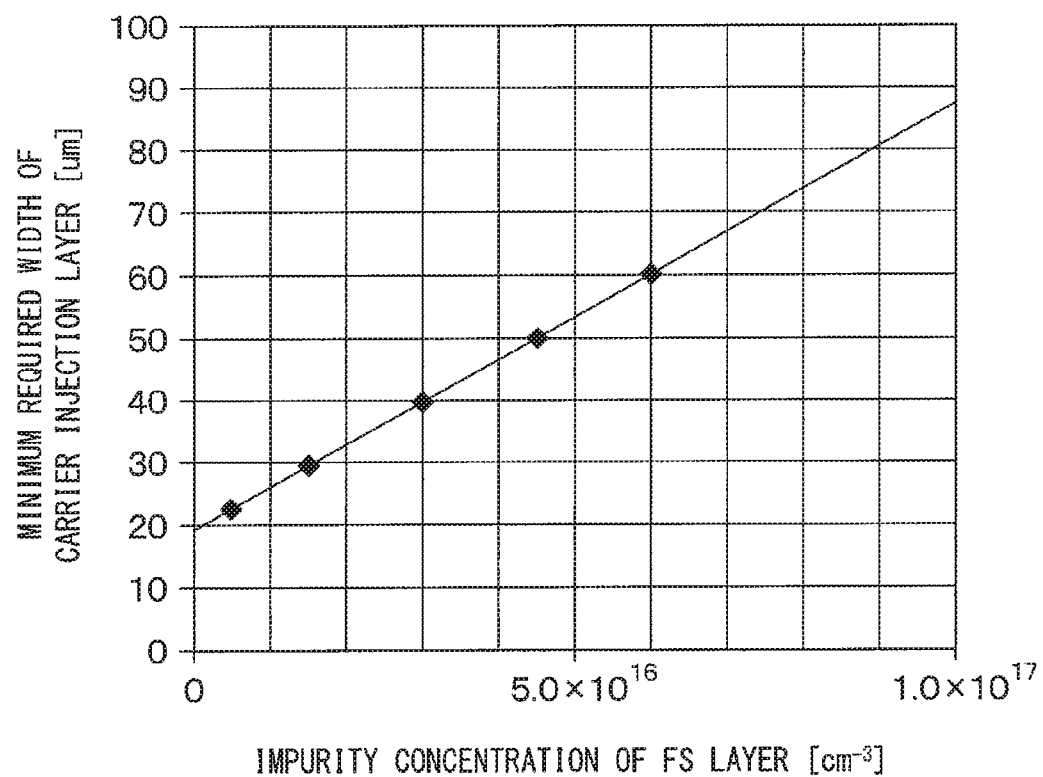
FIG. 7 is a graph showing the relationship between the minimum required width of the carrier injection layer and the impurity concentration of the field stop layer.

Thus, the present inventors conduct a thorough review on the relationship between the impurity concentration of the FS layer 20 and the width of the carrier injection layer 24, and acquire the simulation result as illustrated in FIG. 7. FIG. 7 shows the simulation result of the semiconductor device in which the width of the semiconductor substrate 10 is 75~85 µm and the resistivity is 40~50 Ω·m in an 800-Volt breakdown voltage band. The minimum required width of the carrier injection layer 24 in FIG. 7 refers to the minimum width of the carrier injection layer 24 required to allow the voltage across the PN junction formed between the carrier injection layer 24 and the FS layer 20 to exceed the potential barrier (that is, about 0.7 volt).

As illustrated in FIG. 7, the impurity concentration of the FS layer 20 and the minimum required width of the carrier injection layer 24 are in a proportional relationship. The present inventors found out that, given that the impurity concentration of the FS layer 20 is Nfs in a unit of cm$^{-3}$ and the minimum required width is W in a unit of µm, the voltage across the PN junction formed between the carrier injection layer 24 and the FS layer 20 is larger than or equal to the potential barrier during the recovery state by satisfying the following mathematical formula based on FIG. 7.

$$W > 6.8 \times 10 \times Nfs + 20 \quad \text{(Formula 1)}$$

Accordingly, the carrier injection layer 24 and the FS layer 20 are configured to satisfy the above-mentioned formula in the present embodiment.

As described above, the carrier injection layer 24 is formed at the cathode layer 22, and the holes from the carrier injection layer 24 are injected to the drift layer 11 during the recovery state. Therefore, it can be inhibited that the depletion layer formed between the base layer 12 and the drift layer 11 is extended towards the second surface 10b of the semiconductor substrate. Hence, the peak surge voltage during the recovery state is reduced.

Since it can be inhibited that the depletion layer is extended towards the second surface 10b of the semiconductor substrate 10, it is possible to reduce the thickness of the semiconductor substrate 10 to reduce the switching loss. For example, the carrier injection layer 24 may further be applied to a semiconductor device in which the width of the IGBT element 1a is widen and the width of the FWD element 2a is widen for inhibiting the snapback phenomenon in the IGBT element 1a. Accordingly, the snapback phenomenon is inhibited while the peak surge voltage during the recovery state can also be reduced.

The carrier injection layer 24 is arranged to include the center of the cathode layer 22 in the width direction. In other words, the carrier injection layer 24 is arranged at a position where the electron density tends to be the highest during the recovery state. Therefore, the density of electrons, which pass through the FS layer 20 on the carrier injection layer 24, gets larger. Accordingly, the potential level of the FS layer 20 drops dramatically, and the voltage across the PN junction formed between the carrier injection layer 24 and the FS layer 20 rises sufficiently. Hence, the holes from the carrier injection layer 24 can be injected to the drift layer 11 easily.

According to the first embodiment, the carrier injection layer 24 and the FS layer 20 are configured by satisfying the above-mentioned mathematical formula 1. Thus, it is possible to suppress the occurrence of a situation that no holes are injected from the carrier injection layer 24 into the drift layer 11 and the peak surge voltage during the recovery state is not reduced.

Only one carrier injection layer 24 is arranged at the cathode layer 22. It is also possible to reduce the level of the peak surge voltage during the recovery state and suppress an increase in an on-voltage of the FWD element 2a.

The following describes an example with reference to FIG. 6. FIG. 6 illustrates that the holes are injected during the recovery state and the level of peak surge voltage gets smaller when the width of the carrier injection layer 24 is configured to be 40 μm or more. When a plurality of carrier injection layers 24 are provided, it is required to configure the width of each carrier injection layer 24 to be 40 μm or more so that the holes can be injected from each carrier injection layer 24 to the drift layer 11. For example, when the width of one carrier injection layer 24 is configured to be 90 μm, the reduction effect of a width of 50 μm can be obtained as illustrated in FIG. 6. On the other hand, two carrier injection layers 24 may be provided. When the widths of two respective carrier injection layers 24 are configured to be 45 μm, the total width of the entire carrier injection layer 24 is 90 μm. With each carrier injection layer 24, the reduction effect of a width of 5 μm can be obtained. When two carrier injection layers 24 are respectively provided with a width of 65 μm, the reduction effect of a width of 25 μm in each carrier injection layer 24 can be attained. The width of the entire carrier injection layer 24 is 130 μm. In this situation, when the FWD element 2a is in the on-state, the number of electrons injected from the cathode layer 22 decreases so that the on-voltage of the FWD element 2a increases. Accordingly, when only one carrier injection layer 24 is arranged as in the present embodiment, it is possible to reduce the level of the peak surge voltage during the recovery state while suppressing an increase in the on-voltage of the FWD element 2a.

Other Embodiments

Although the present disclosure is described based on the above embodiments, the present disclosure is not limited to the embodiments and the structures. The present disclosure is intended to cover various modification examples and equivalents thereof. Furthermore, various combination and formation, and other combination and formation including one, more than one or less than one element may be made in the present disclosure.

For example, the above-mentioned first embodiment describes that the first-type conductivity corresponds to N-type; and the second-type conductivity corresponds to P-type. However, the first-type conductivity may be configured as P-type, and the second-type conductivity may be configured as N-type.

The above-mentioned first embodiment describes the trench-gate semiconductor device. However, a planar-type semiconductor device may be provided. The planar-type semiconductor device is configured such that the gate electrode 17 is arranged on the first surface 10a of the semiconductor substrate 10.

Moreover, the carrier injection layer 24 may not to be included at the center of the cathode layer 22 in the width direction. Even though the semiconductor device is configured as described above, the similar effect as in the first embodiment may also be attained if the holes are injected into the drift layer 11 from the carrier injection layer 24. When the center of the carrier injection layer 24 in the width direction is deviated from the center of the cathode layer 22 in the width direction, the density of electrons passing through the FS layer 20 on the carrier injection layer 24 is in decrease. Thus, the minimum required width of the carrier injection layer 24 illustrated in FIG. 7 is in translational form in an upward direction with respect to the impurity concentration of the FS layer. In other words, the minimum required width of the carrier injection layer 24 increases along with a change in the impurity concentration of the carrier injection layer 24.

According to the first embodiment, a plurality of the carrier injection layers 24 may be provided.

The invention claimed is:

1. A semiconductor device provided with an insulated-gate bipolar transistor (IGBT) region having an IGBT element and a freewheeling diode (FWD) region having an FWD element, the semiconductor device comprising:
a semiconductor substrate having the IGBT region and the FWD region,
wherein the semiconductor substrate includes:
a drift layer having a first-type conductivity;
a base layer having a second-type conductivity and formed on the drift layer;
an emitter region having the first-type conductivity configured to be a surface layer portion of the base layer, and configured to be isolated from the drift layer to interpose the base layer between the drift layer and the emitter region, the emitter region having a higher impurity concentration as compared with the drift layer;
a gate insulation film arranged on a surface of the base layer, which is between the emitter region and the drift layer;
a gate electrode arranged on the gate insulation film;
a field stop layer having the first-type conductivity facing the base layer to interpose the drift layer between the field stop layer and the base layer, the field stop layer having a higher impurity concentration as compared with the drift layer;
a collector layer having the second-type conductivity facing the drift layer to interpose the field stop layer between the collector layer and the drift layer;
a cathode layer having the first-type conductivity facing the drift layer to interpose the field stop layer between the cathode layer and the drift layer, the cathode layer being adjacent to the collector layer;
a first electrode electrically connected to the base layer and the emitter region; and
a second electrode electrically connected to the collector layer and the cathode layer,
wherein the cathode layer is formed with a carrier injection layer as a single layer having the second-type conductivity at a position isolated from the collector layer,
wherein the carrier injection layer has a PN junction with the field stop layer and is electrically connected to the second electrode,
wherein, when a first carrier in the FWD element passes through the field stop layer on the carrier injection layer and flows into the cathode layer in a situation where a forward-biased current is cut off from a state in which the forward-biased current flows through the FWD element, a second carrier is injected from the second electrode into the drift layer through the carrier injection layer, and wherein a perimeter of the FWD region is enclosed by the IGBT region as viewed from a top surface of the semiconductor substrate, wherein a center of the carrier injection layer in a width direction of the carrier injection layer coincides with a center of the cathode layer in a width direction of the cathode layer, wherein the cathode layer extends in an extension direction along a single direction as the extension direction of the cathode layer, wherein the carrier injection layer extends in an extension direction along the extension direction of the cathode layer, wherein the width direction of the carrier injection layer is a direction perpendicular to the extension direction of the carrier injection layer, and wherein the width direction of the cathode layer is a direction perpendicular to the extension direction of the cathode layer.

2. The semiconductor device according to claim 1, wherein the carrier injection layer is surrounded by the cathode layer.

3. A semiconductor device provided with an insulated-gate bipolar transistor (IGBT) region having an IGBT element and a freewheeling diode (FWD) region having an FWD element, the semiconductor device comprising:

a semiconductor substrate having the IGBT region and the FWD region, wherein the semiconductor substrate includes:

a drift layer having a first-type conductivity;

a base layer having a second-type conductivity and formed on the drift layer;

an emitter region having the first-type conductivity configured to be a surface layer portion of the base layer, and configured to be isolated from the drift layer to interpose the base layer between the drift layer and the emitter region, the emitter region having a higher impurity concentration as compared with the drift layer;

a gate insulation film arranged on a surface of the base layer, which is between the emitter region and the drift layer;

a gate electrode arranged on the gate insulation film;

a field stop layer having the first-type conductivity facing the base layer to interpose the drift layer between the field stop layer and the base layer, the field stop layer having a higher impurity concentration as compared with the drift layer;

a collector layer having the second-type conductivity facing the drift layer to interpose the field stop layer between the collector layer and the drift layer;

a cathode layer having the first-type conductivity facing the drift layer to interpose the field stop layer between the cathode layer and the drift layer, the cathode layer being adjacent to the collector layer;

a first electrode electrically connected to the base layer and the emitter region; and a second electrode electrically connected to the collector layer and the cathode layer, wherein the cathode layer is formed with a carrier injection layer having the second-type conductivity at a position isolated from the collector layer, wherein the carrier injection layer has a PN junction with the field stop layer and is electrically connected to the second electrode, wherein, when a first carrier in the FWD element passes through the field stop layer on the carrier injection layer and flows into the cathode layer in a situation where a forward-biased current is cut off from a state in which the forward-biased current flows through the FWD element, a second carrier is injected from the second electrode into a drift layer through the carrier injection layer, and wherein a center of the carrier injection layer in a width direction of the carrier injection layer coincides with a center of the cathode layer in a width direction of the cathode layer, wherein the cathode layer extends in an extension direction along a single direction as the extension direction of the cathode layer, wherein the carrier injection layer extends in an extension direction along the extension direction of the cathode layer, wherein the width direction of the carrier injection layer is a direction perpendicular to the extension direction of the carrier injection layer, and wherein the width direction of the cathode layer is a direction perpendicular to the extension direction of the cathode layer.

4. The semiconductor device according to claim 3, wherein the carrier injection layer is surrounded by the cathode layer.

* * * * *